US010115628B2

(12) United States Patent
Peng

(10) Patent No.: US 10,115,628 B2
(45) Date of Patent: Oct. 30, 2018

(54) SEMICONDUCTOR DEVICE AND MANUFACTURE THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Shimin Peng, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/651,918

(22) Filed: Jul. 17, 2017

(65) Prior Publication Data

US 2018/0040506 A1 Feb. 8, 2018

(30) Foreign Application Priority Data

Aug. 4, 2016 (CN) .......................... 2016 1 0632888

(51) Int. Cl.
*H01L 23/48* (2006.01)
*H01L 23/52* (2006.01)
(Continued)

(52) U.S. Cl.
CPC .... *H01L 21/76816* (2013.01); *H01L 21/7684* (2013.01); *H01L 21/76805* (2013.01);
(Continued)

(58) Field of Classification Search
USPC ......... 257/774, 621, E21.597; 438/629, 630, 438/637–640, 668, 672, 675, 678, 635,
(Continued)

(56) References Cited

U.S. PATENT DOCUMENTS 5,719,089 A * 2/1998 Cherng ............... H01L 21/3065
257/E21.218
6,200,904 B1 3/2001 Tan et al.
(Continued)

FOREIGN PATENT DOCUMENTS

TW 442939 B 6/2001

OTHER PUBLICATIONS

European Search Report, corresponding to EP17184174, dated Dec. 14, 2017, 6 pages.

*Primary Examiner* — Tram H Nguyen
(74) *Attorney, Agent, or Firm* — Innovation Counsel LLP

(57) ABSTRACT

A semiconductor device and its manufacturing method are presented. The manufacturing method entails:
forming a dielectric layer on a semiconductor substrate;
forming a functional layer on the dielectric layer;
forming a hard mask layer on the functional layer;
patterning the semiconductor substrate to form an opening on the semiconductor substrate, wherein the opening goes through the hard mask layer, the functional layer and extends into the dielectric layer;
performing an oxidization process on side surfaces of the functional layer inside the opening to form oxide layers;
performing a first process on the semiconductor substrate to remove a portion of the dielectric layer underneath the opening to expose the semiconductor substrate; and
removing the oxide layers on the side surfaces of the functional layer to form a contact hole.

(Continued)

The contact hole has a wider opening in the upper part than in the lower part.

19 Claims, 12 Drawing Sheets

(51) Int. Cl.
| | | |
|---|---|---|
| *H01L 29/40* | (2006.01) | |
| *H01L 21/768* | (2006.01) | |
| *H01L 23/528* | (2006.01) | |
| *H01L 23/532* | (2006.01) | |
| *H01L 23/535* | (2006.01) | |

(52) U.S. Cl.
CPC .. *H01L 21/76814* (2013.01); *H01L 21/76895* (2013.01); *H01L 23/528* (2013.01); *H01L 23/535* (2013.01); *H01L 23/53257* (2013.01); *H01L 23/53295* (2013.01)

(58) Field of Classification Search
USPC .................................................. 438/643, 627
See application file for complete search history.

(56) References Cited

U.S. PATENT DOCUMENTS

| | | |
|---|---|---|
| 2006/0046495 A1 | 3/2006 | Frohberg et al. |
| 2007/0034955 A1 | 2/2007 | Kim et al. |
| 2017/0140982 A1* | 5/2017 | Tien .................. H01L 21/76877 |

* cited by examiner

SEMICONDUCTOR DEVICE AND MANUFACTURE THEREOF

CROSS-REFERENCE TO RELATED APPLICATION

This application claims priority to and benefit of Chinese Patent Application No. 201610632888.X filed on Aug. 4, 2016, which is incorporated herein by reference in its entirety.

BACKGROUND (a) Field of the Invention

This inventive concept relates generally to semiconductor techniques, and more specifically to a semiconductor device and manufacture thereof.

(b) Description of the Related Art

Semiconductor devices are being made increasingly dense in a wafer, the size of each individual device and the gap between neighboring devices have been substantially decreased. While smaller device size increases the circuit density, it also brings new challenges in the manufacturing process. To compensate for reduced capacitance as a result of smaller device size, the capacitor need to be made higher, or be made into a cylinder or a concave shape. As the size of a contact apparatus or a via hole decreases, it becomes increasingly difficult to completely fill those contact holes due to their high aspect ratio.

FIGS. 1A and 1B show schematic diagrams of one example of using a conventional semiconductor manufacturing method to form a contact apparatus. Referring to FIG. 1A, first, a dielectric layer 12 is formed on a substrate 11, an anti-reflective layer 13 is formed on the dielectric layer 12, then the structure on the substrate 11 is patterned to form an opening that goes through the anti-reflective layer 13 and the dielectric layer 12 and exposes a portion of the substrate 11. Then, a compound layer is formed on the upper surface of the substrate 11, wherein the compound layer comprises a titanium layer 14 and titanium nitride layer 15. Using Chemical Vapor Deposition or other suitable deposition methods, a tungsten layer 16 may be deposited on the supper surface of the substrate 11 to form a contact apparatus. Because the side surfaces of the opening are perpendicular to the upper surface of the anti-reflective layer 13, an overhang 17 may be formed on the upper part of the opening during the deposition of the tungsten layer 16, which forms a hollow hole 18 in the tungsten layer 16.

Then, perform a Chemical Mechanical Polishing (CMP) process on the upper surface of the structure in FIG. 1A to expose the dielectric layer 12, as shown in FIG. 1B. Because of the existence of the hollow hole 18 in the tungsten layer 16, an impurity 19 might enter the hollow hole 18 during the CMP process, which will severely affect the performance of the resulted semiconductor device.

Therefore a new semiconductor manufacturing method that can eliminate or reduce hollow holes in the contact apparatus, thus improve the quality of the resulted semiconductor device, is desirable.

SUMMARY

This summary is related to some of many embodiments of the inventive concept disclosed herein and is not intended to limit the scope of this inventive concept.

A method for manufacturing a semiconductor apparatus, comprising:

providing a semiconductor substrate;

forming a dielectric layer on the semiconductor substrate;

forming a functional layer on the dielectric layer, wherein the functional layer is capable of reacting with oxygen;

forming a hard mask layer on the functional layer;

patterning the semiconductor substrate to form an opening on the semiconductor substrate, wherein the opening goes through the hard mask layer and the functional layer and extends into the dielectric layer;

performing an oxidization process on side surfaces of the functional layer inside the opening to form oxide layers; and performing a first process on the semiconductor substrate, wherein the first process comprises:

removing a portion of the dielectric layer that is underneath the opening to expose the semiconductor substrate; and removing the oxide layers on the side surfaces of the functional layer to form a contact hole, wherein a first portion of the contact hole is in the functional layer, a second portion of the contact hole is in the dielectric layer, the width of the first portion of the contact hole is larger than the width of the second portion of the contact hole.

Additionally, the aforementioned method may further entail filling the contact hole with a conductive material to form a contact apparatus.

Additionally, in the aforementioned method, the functional layer may include a transitional layer formed on the dielectric layer and an amorphous carbon layer formed on the transitional layer, wherein the transitional layer is an insulated dielectric layer comprising carbon and silicon.

Additionally, in the aforementioned method, in the transitional layer, a carbon concentration in a first side that is adjacent to the amorphous carbon layer is higher than that in a second side that is adjacent to the dielectric layer.

Additionally, in the aforementioned method, patterning the semiconductor substrate may comprise:

forming a patterned photoresist layer on the hard mask layer; and etching the semiconductor substrate with respect to the patterned photoresist layer to form the opening.

Additionally, in the aforementioned method, the oxidization process may comprise removing the patterned photoresist layer.

Additionally, in the aforementioned method, performing an oxidization process on the side surfaces of the functional layer inside the opening may comprise:

oxidizing side surfaces of the amorphous carbon layer and the transitional layer inside the opening to remove a portion of the amorphous carbon layer; and forming oxide layers on the side surfaces of the transitional layer.

Additionally, in the aforementioned method, the first process may comprise:

performing a dry etching process on the semiconductor substrate to remove a portion of the dielectric layer underneath the opening to expose the semiconductor substrate;

removing the hard mask layer; and performing a wet etching process on the semiconductor substrate to remove the oxide layers on the side surfaces of the transitional layer to form a contact hole.

Additionally, in the aforementioned method, the first process may comprise:

removing a portion of the dielectric layer underneath the opening, the hard mask layer and the amorphous carbon layer; and performing a wet etching process on the semiconductor substrate to remove the oxide layers on the side surfaces of the transitional layer to form a contact hole.

Additionally, in the aforementioned method, removing a portion of the dielectric layer underneath the opening, the hard mask layer and the amorphous carbon layer may comprise:

performing a dry etching process on the semiconductor substrate to remove the hard mask layer and further extend the opening into the dielectric layer;

removing the amorphous carbon layer; and performing a dry etching process on the semiconductor substrate to remove a portion of the dielectric layer underneath the opening to expose the semiconductor substrate.

Additionally, in the aforementioned method, the oxidization process comprises a processing using oxygen ion.

Additionally, in the aforementioned method, the dielectric layer is made of silicon-based oxide.

Additionally, in the aforementioned method, the dielectric layer comprises:

a first dielectric layer formed on the semiconductor substrate, wherein the first dielectric layer is made of Phosphosilicate Glass (PSG), Borophosphosilicate Glass (BPSG), or silicon-based oxide; and a second dielectric layer formed on the first dielectric layer, wherein the second dielectric layer is made of silicon-based oxide.

Additionally, the aforementioned method further comprises:

forming a conductive material layer on the semiconductor substrate, wherein the conductive material layer fills the contact hole; and performing a Chemical Mechanical Polishing (CMP) process on the conductive material layer so that the upper surface of the remaining conductive material layer is on the same horizontal level with the upper surface of the functional layer to form a contact apparatus.

This inventive concept further presents a semiconductor apparatus, comprising:

a semiconductor substrate;

a dielectric layer formed on the semiconductor substrate;

a functional layer formed on the dielectric layer, wherein the functional layer comprises a transitional layer and an amorphous carbon layer formed on the transitional layer, wherein the transitional layer is an insulated dielectric layer comprising carbon and silicon;

a contact hole that goes through the functional layer and the dielectric layer and exposes a portion of the semiconductor substrate, wherein a first portion of the contact hole is in the functional layer, a second portion of the contact hole is in the dielectric layer, and the width of the first portion of the contact hole is larger than the width of the second portion of the contact hole.

Additionally, in the aforementioned semiconductor apparatus, in the transitional layer, a carbon concentration in a first side that is adjacent to the amorphous carbon layer may be higher than that in a second side that is adjacent to the dielectric layer.

Additionally, the aforementioned semiconductor apparatus may further comprise:

a contact apparatus formed by filling the contact hole with a conductive material.

This inventive concept further presents another semiconductor apparatus, comprising:

a semiconductor substrate;

a dielectric layer formed on the semiconductor substrate;

a functional layer formed on the dielectric layer, wherein the functional layer comprises a transitional layer that is an insulated dielectric layer comprising carbon and silicon; and a contact hole that goes through the functional layer and the dielectric layer and exposes a portion of the semiconductor substrate, wherein a first portion of the contact hole is in the functional layer, a second portion of the contact hole is in the dielectric layer, and the width of the first portion of the contact hole is larger than the width of the second portion of the contact hole.

Additionally, in the aforementioned semiconductor apparatus, the functional layer may further comprise an amorphous carbon layer formed on the transitional layer.

Additionally, the aforementioned semiconductor apparatus may further comprise a contact apparatus formed by filling the contact hole with a conductive material.

DETAILED DESCRIPTION OF THE EMBODIMENTS

Figure 1A:
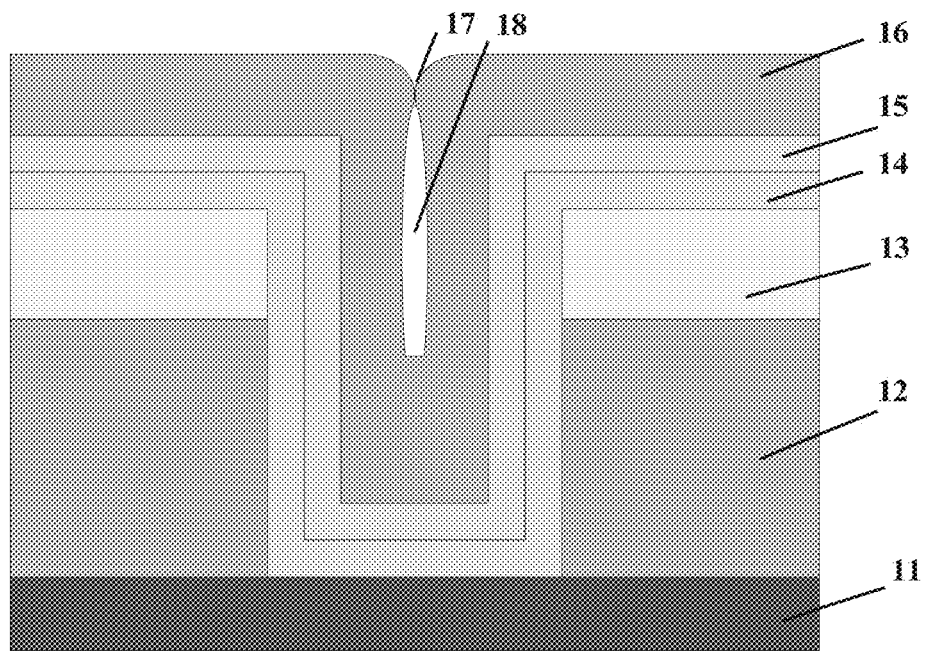
FIGS. 1A and 1B show schematic diagrams of one stage of a conventional semiconductor manufacturing method.
Figure 1B:
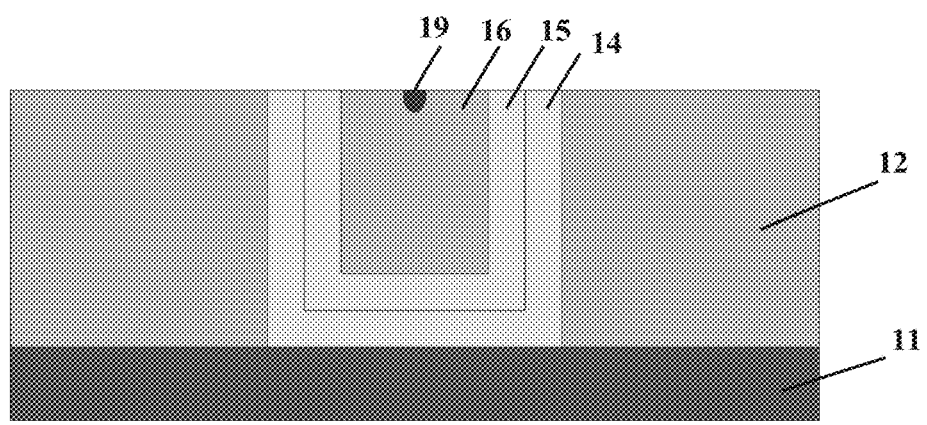

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatus for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2:
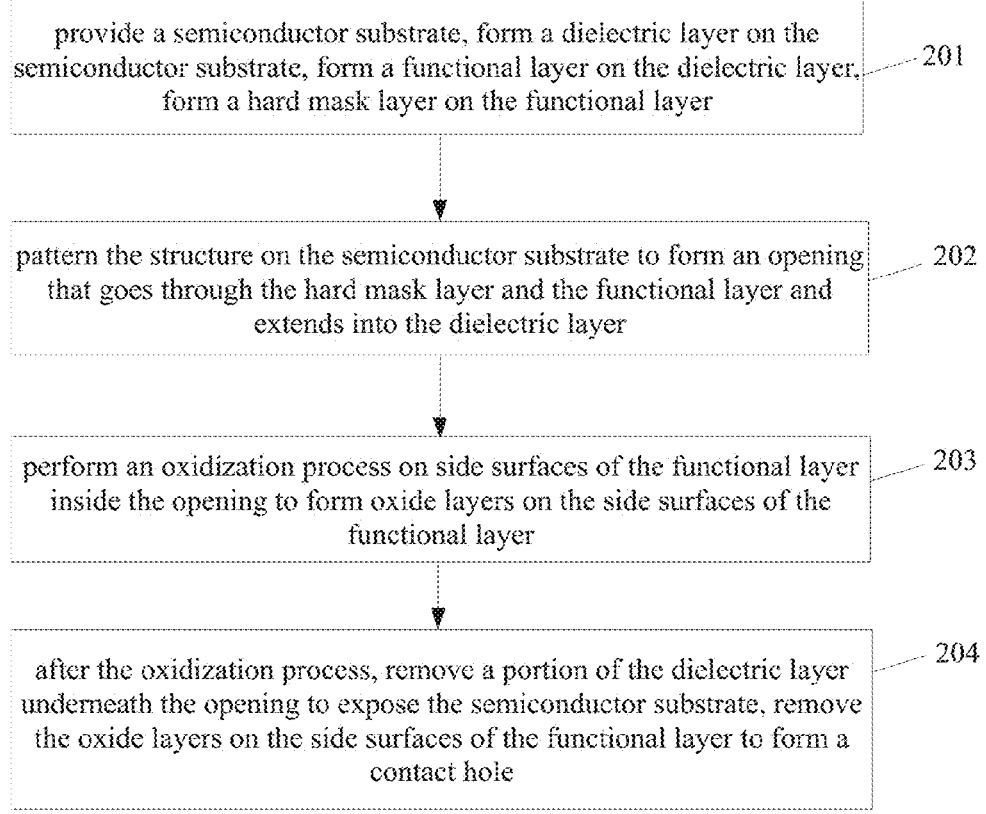
FIG. 2 shows a flowchart that illustrates the steps in a method for manufacturing a semiconductor apparatus in accordance with one or more embodiments of the inventive concept.

FIG. 2 shows a flowchart that illustrates the steps in a method for manufacturing a semiconductor apparatus in accordance with one or more embodiments of the inventive concept. These steps are described below.

Step 201: provide a semiconductor substrate, form a dielectric layer on the semiconductor substrate, form a functional layer on the dielectric layer wherein the functional layer is capable of reacting with oxygen, form a hard mask layer on the functional layer.

In some embodiments, the dielectric layer may be made of silicon-based oxide. For example, the dielectric layer may comprise a first dielectric layer formed on the semiconductor substrate and a second dielectric layer formed on the first dielectric layer, wherein the first dielectric layer may be made of Phosphosilicate Glass (PSG), Borophosphosilicate Glass (BPSG), or silicon-based oxide, and the second dielectric layer may be made of silicon-based oxide.

In some embodiments, the functional layer may comprise a transitional layer formed on the dielectric layer and an amorphous carbon layer formed on the transitional layer, wherein the transitional layer is an insulated dielectric layer comprising carbon and silicon. For example, the transitional layer may be a dielectric layer with ultra low permittivity.

In the transitional layer, a carbon concentration in a first side that is adjacent to the amorphous carbon layer is higher than that in a second side that is adjacent to the dielectric layer. That is, the carbon concentration in the transitional layer keeps increasing along the direction from the dielectric layer to the amorphous carbon layer. The increase of the carbon concentration in the transitional layer can be continuous or step wise.

Step 202: pattern the structure on the semiconductor substrate to form an opening that goes through the hard mask layer and the functional layer and extends into the dielectric layer. Patterning the structure on the semiconductor substrate comprises forming a patterned photoresist layer on the hard mask layer and etching the semiconductor substrate with respect to the patterned photoresist layer to form the opening.

Step 203: perform an oxidization process on side surfaces of the functional layer inside the opening.

In some embodiments, the oxidization process comprises oxidizing side surfaces of the amorphous carbon layer and the transitional layer to remove a portion of the amorphous carbon layer and form oxide layers on the side surfaces of the transitional layer. In some embodiments, the oxide layers formed on the side surfaces of the transitional layer have a porous structure.

In some embodiments, the oxidization process comprises a process using oxygen ion.

Additionally, the patterned photoresist layer may be removed during the oxidization process.

Step 204: after the oxidization process, perform a first process on the semiconductor substrate to remove a portion of the dielectric layer underneath the opening to expose the semiconductor substrate, remove the oxide layers on the side surfaces of the functional layer to form a contact hole.

A first portion of the contact hole is in the functional layer, a second portion of the contact hole is in the dielectric layer, the width of the first portion of the contact hole is larger than the width of the second portion of the contact hole.

In one embodiment, the first process may comprise performing a dry etching process on the semiconductor substrate to remove a portion of the dielectric layer underneath the opening to expose the semiconductor substrate; removing the hard mask layer; and performing a wet etching process on the semiconductor substrate to remove the oxide layers formed on the side surfaces of the transitional layer to form the contact hole.

In another embodiment, the first process may comprise removing a portion of the dielectric layer underneath the opening to expose the semiconductor substrate; removing the hard mask layer and the amorphous carbon layer; performing a wet etching process on the semiconductor substrate to remove the oxide layers formed on the side surfaces of the transitional layer to form the contact hole.

In this embodiment, the process to remove a portion of the dielectric layer underneath the opening, the hard mask layer, and the amorphous carbon layer comprises performing a dry etching process on the semiconductor substrate to remove the hard mask layer and to further extend the opening into the dielectric layer; removing the amorphous carbon layer; and performing a dry etching process on the semiconductor substrate to remove a portion of the dielectric layer underneath the opening to expose the semiconductor substrate.

After the contact hole is formed, the contact hole may be filled with conductive materials such as tungsten to form a contact apparatus.

In some embodiments, the process to form a contact apparatus comprises forming a conductive material layer on the semiconductor substrate wherein the conductive material layer fills the contact hole; performing a CMP process on the conductive material layer so that the upper surface of the remaining conductive material layer is on the same horizontal level with the upper surface of the functional layer to form the contact apparatus.

In this inventive concept, the contact hole has a wider opening in the upper part than in the lower part. This design can reduce, if not eliminate, the small holes that would otherwise be formed in the contact apparatus, thus improve the performance of the resulted semiconductor device.

The detail embodiments of this inventive concept are described below through some examples.

A First Embodiment

Figure 3A:
FIGS. 3A, 3B, 3C, 3D, 3E, 3F, 3G, 3H and 3I show schematic diagrams that illustrate the elements and/or structures formed in a method for manufacturing a semiconductor apparatus in accordance with one or more embodiments of the inventive concept.

Referring to FIG. 3A, a dielectric layer 32 is formed on a semiconductor substrate 31. The dielectric layer 32 may be made of silicon-based oxide. For example, the dielectric layer 32 may further comprise a first dielectric layer 321 formed on the semiconductor substrate 31 and a second dielectric layer 322 formed on the first dielectric layer 321. The first dielectric layer 321 may be made of Phosphosilicate Glass (PSG), Borophosphosilicate Glass (BPSG), or silicon-based oxide, the second dielectric layer 322 may be made of silicon-based oxide.

Figure 3B:

Referring to FIG. 3B, a functional layer 33 is formed on the dielectric layer 32. A hard mask layer 34 is formed on the functional layer 33, wherein the functional layer 33 is capable of reacting with oxygen.

In some embodiments, the functional layer 33 may further comprise a transitional layer 331 formed on the dielectric layer 32 and an amorphous carbon layer 332 formed on the transitional layer 331. The transitional layer 331 is an insulated dielectric layer comprising carbon and silicon. For example, the transitional layer 331 may be a dielectric layer with ultra low permittivity.

In the transitional layer 331, a carbon concentration in a first side that is adjacent to the amorphous carbon layer 332 is higher than that in a second side that is adjacent to the dielectric layer 32. That is, the carbon concentration in the transitional layer 331 increases along the direction from the dielectric layer 32 to the amorphous carbon layer 332. The increase of the carbon concentration in the transitional layer 331 can be continuous or step wise.

In some embodiments, the hard mask layer 34 may be made of silicon-based oxide.

Figure 3C:
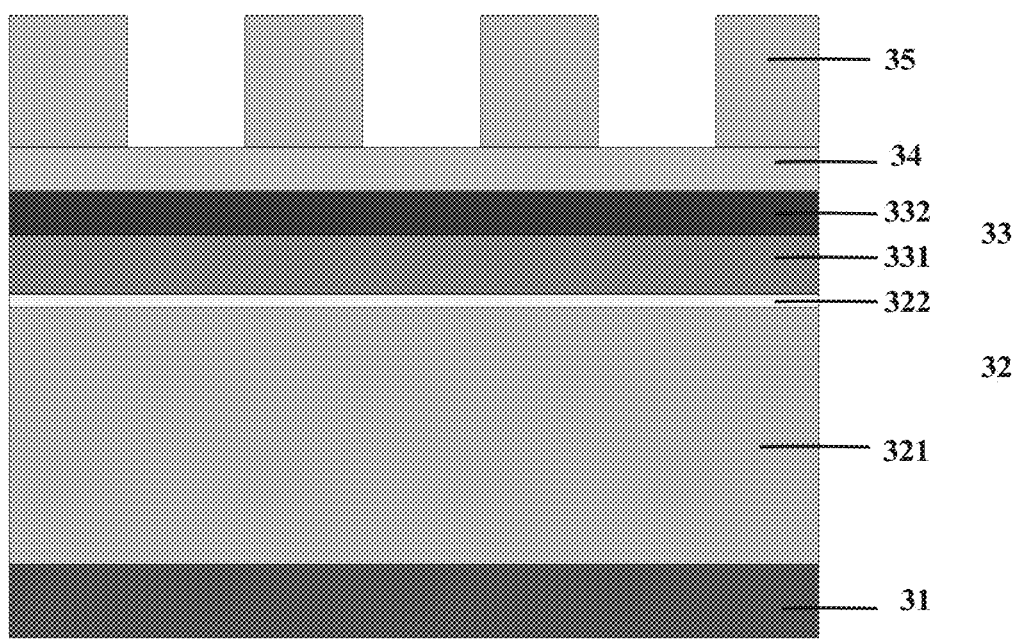
Figure 3D:
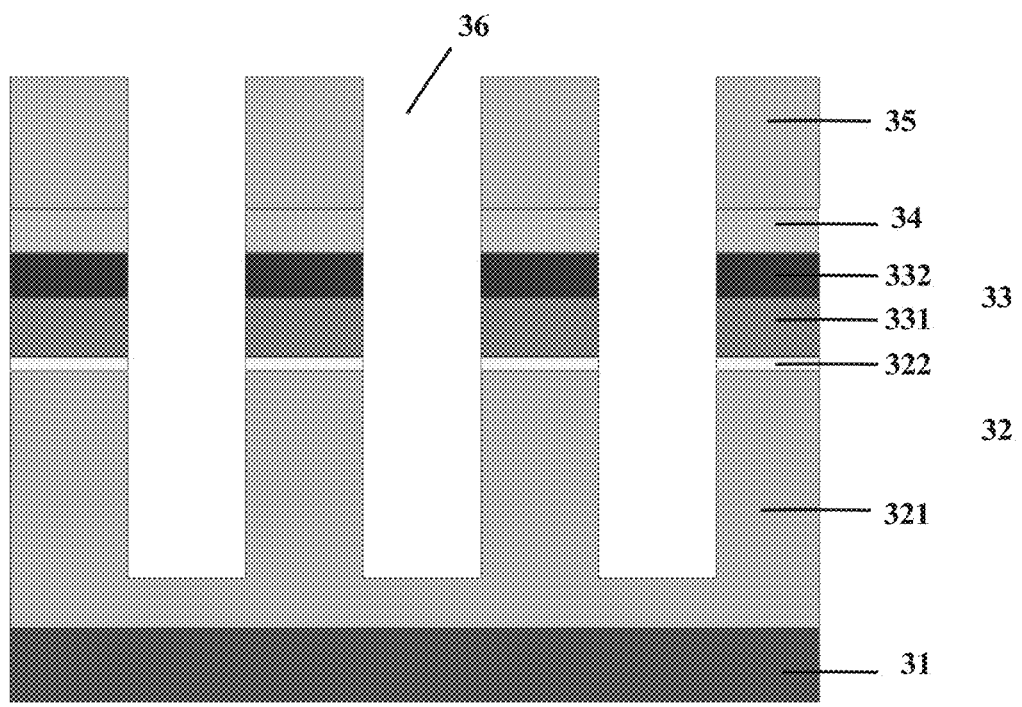

Referring to FIGS. 3C and 3D, a patterned photoresist layer 35 is formed on the hard mask layer 34. An etching process is performed on the semiconductor substrate 31 with respect to the patterned photoresist layer 35 to form an opening 36, wherein the opening 36 goes through the hard mask layer 34, the functional layer 33 and extends into the dielectric layer 32.

Figure 3E:
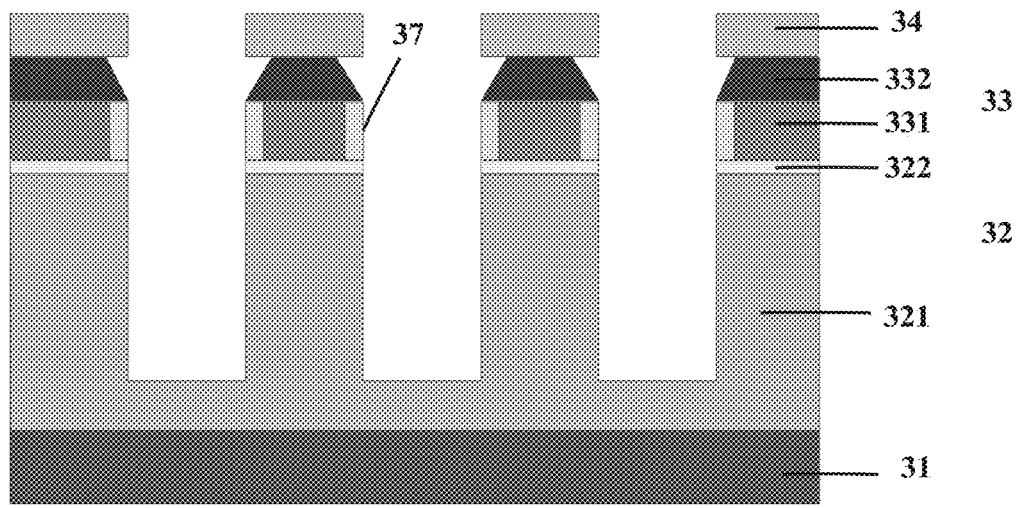

Referring to FIG. 3E, an oxidization process using oxygen ion is performed on the semiconductor substrate 31 to remove the patterned photoresist layer 35 and oxidize side surfaces of the amorphous carbon layer 332 and the transitional layer 331 inside the opening 36. A portion of the amorphous carbon layer 332 is removed during this process. The side surfaces of the transitional layer 331 are oxidized to form oxide layers 37. The oxide layers 37 have a porous structure.

Figure 3F:
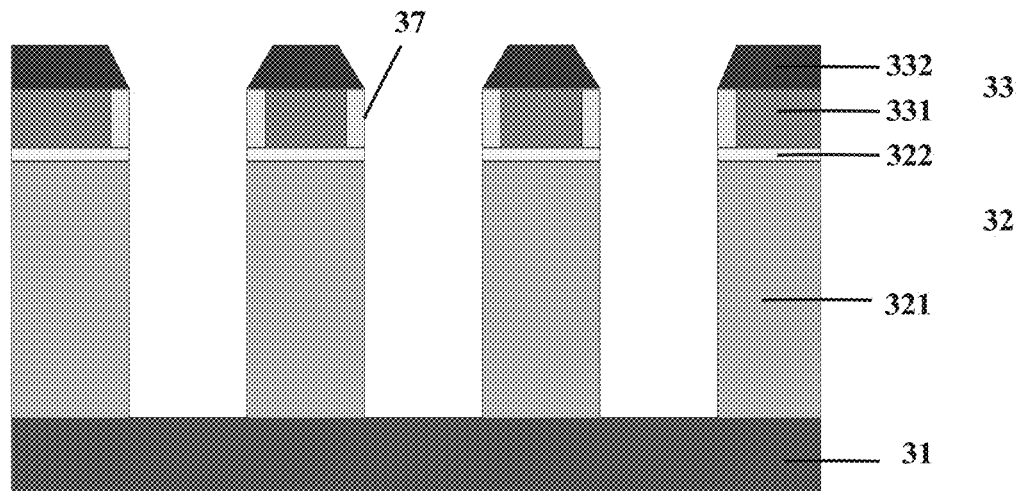

Referring to FIG. 3F, after the oxidization process, a dry etching process is performed on the semiconductor substrate 31 to remove the hard mask layer 34 and a portion of the dielectric layer 32 that is underneath the opening 36 to expose the semiconductor substrate 31.

Figure 3G:
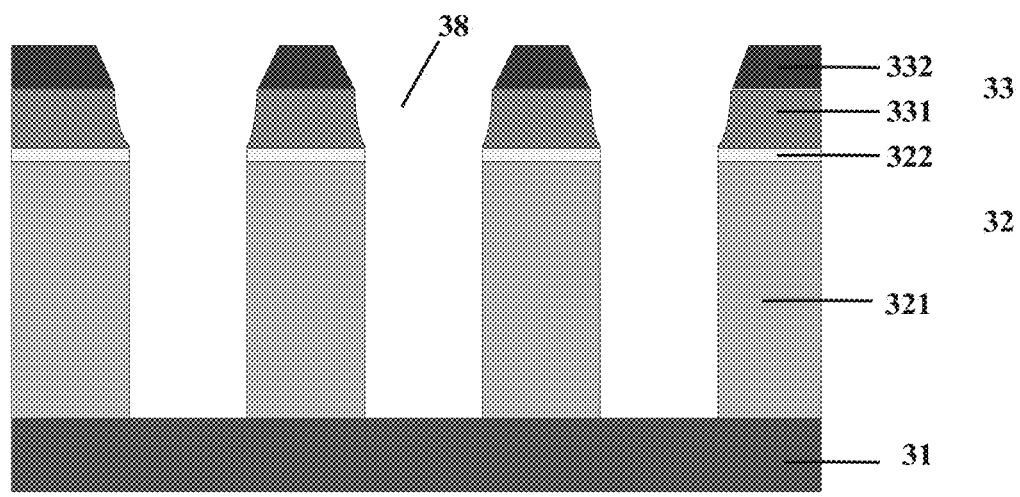

Referring to FIG. 3G, perform a wet etching process on the semiconductor substrate 31 to remove the oxide layers 37 on the side surfaces of the functional layer 33. Because the oxide layers 37 have a porous structure and a high etching ratio, a contact hole 38 as shown in FIG. 3G can be formed.

A first portion of the contact hole 38 is in the functional layer 33, a second portion of the contact hole 38 is in the dielectric layer 32, the width of the first portion of the contact hole 38 is larger than the width of the second portion of the contact hole 38.

Figure 3H:
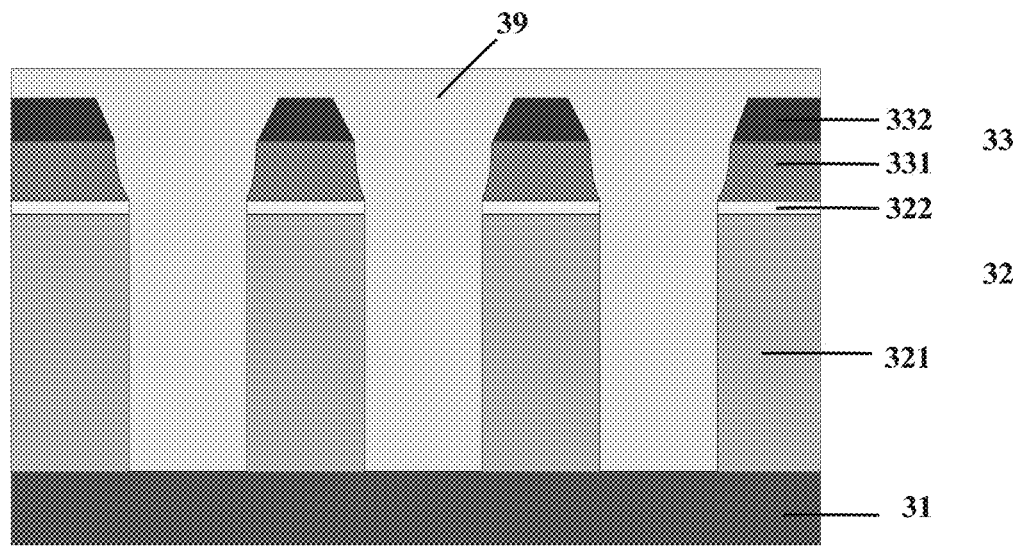
Figure 3I:
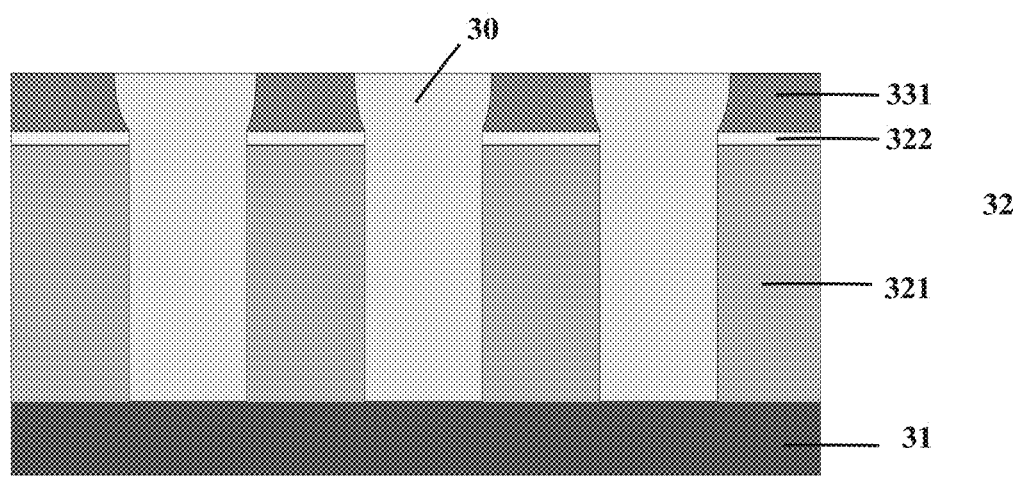

Referring to FIGS. 3H and 3I, after the contact hole 38 is formed, a conductive material layer 39 may be formed on the semiconductor substrate 31 to fill the contact hole 38. Then a CMP process is performed on the conductive material layer 39 so that the upper surface of the remaining conductive material layer 39 is on the same horizontal level with the upper surface of the remaining functional layer 33 to form a contact apparatus 30.

In some embodiments, the conductive material layer 39 may be made of conductive materials such as tungsten.

The contact hole 38 has a wider opening in the upper part than in the lower part. This design can reduce, if not eliminate, the small holes that would otherwise be formed in the contact apparatus 30 due to the overhang 17, thus improving the performance of the resulting semiconductor device.

A Second Embodiment

Figure 4A:
FIGS. 4A, 4B, 4C, 4D, 4E, 4F, 4G, 4H, 4I, 4J and 4K show schematic diagrams that illustrate the elements and/or structures formed in a method for manufacturing a semiconductor apparatus in accordance with one or more embodiments of the inventive concept.

Referring to FIG. 4A, a dielectric layer 42 is formed on a semiconductor substrate 41. The dielectric layer 42 may be made of silicon-based oxide. For example, the dielectric layer 42 may comprise a first dielectric layer 421 formed on the semiconductor substrate 41 and a second dielectric layer 422 formed on the first dielectric layer 421. The first dielectric layer 421 may be made of Phosphosilicate Glass (PSG), Borophosphosilicate Glass (BPSG), or silicon-based oxide. The second dielectric layer 422 may be made of silicon-based oxide.

Figure 4B:

Referring to FIG. 4B, a functional layer 43 is formed on the dielectric layer 42, a hard mask layer 44 is formed on the functional layer 43, wherein the functional layer 43 is capable of reacting with oxygen.

In some embodiments, the functional layer 43 may further comprise a transitional layer 431 formed on the dielectric layer 42 and an amorphous carbon layer 432 formed on the transitional layer 431. The transitional layer 431 is an insulated dielectric layer comprising carbon and silicon. For example, the transitional layer 431 may be a dielectric layer with ultra low permittivity.

In the transitional layer 431, a carbon concentration in a first side that is adjacent to the amorphous carbon layer 432 is higher than that in a second side that is adjacent to the dielectric layer 42. That is, the carbon concentration in the transitional layer 431 keeps increasing along the direction from the dielectric layer 42 to the amorphous carbon layer 432. The increase of the carbon concentration in the transitional layer 431 can be continuous or step wise.

In some embodiments, the hard mask layer 44 may be made of silicon-based oxide.

Figure 4C:
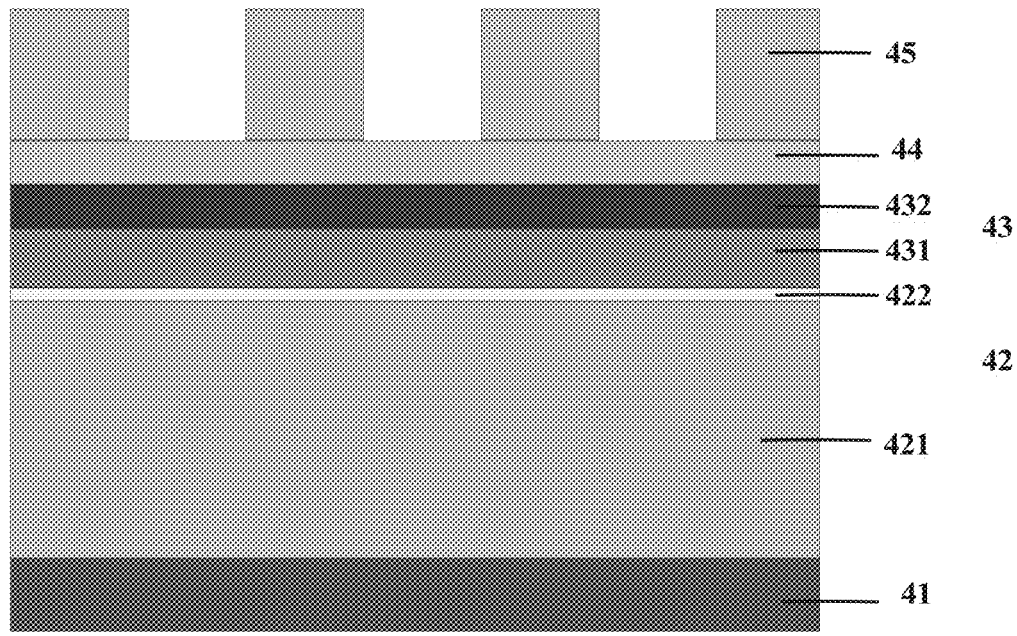
Figure 4D:
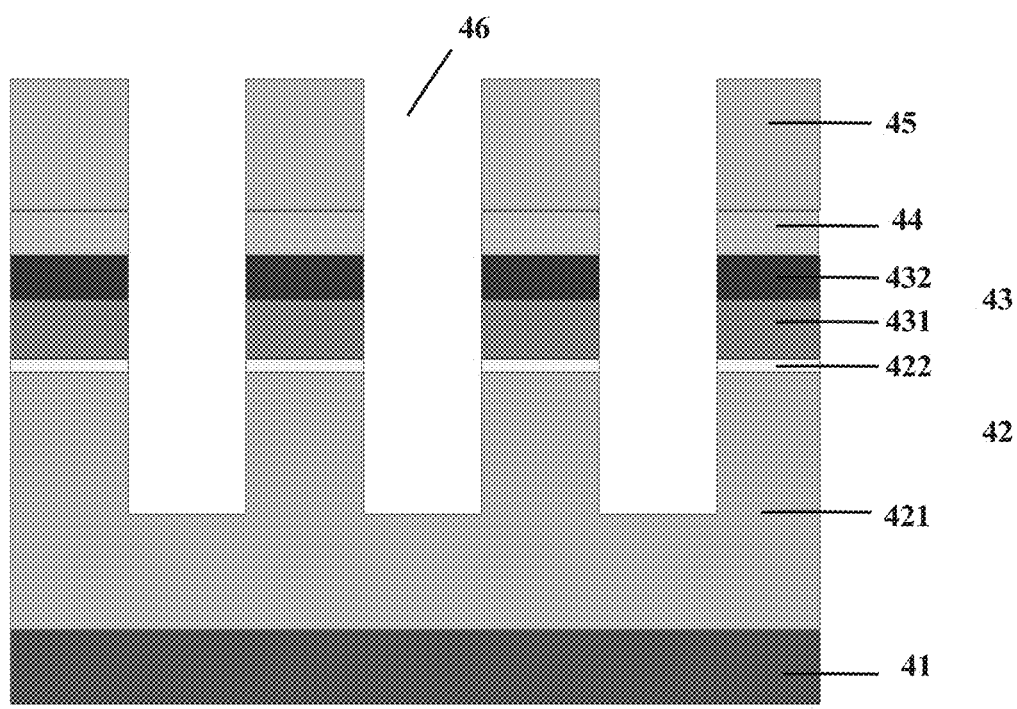

Referring to FIGS. 4C and 4D, a patterned photoresist layer 45 is formed on the hard mask layer 44. An etching process is performed on the semiconductor substrate 41 with respect to the patterned photoresist layer 45 to form an opening 46, wherein the opening 46 goes through the hard mask layer 44, the functional layer 43 and extends into the dielectric layer 42.

Figure 4E:
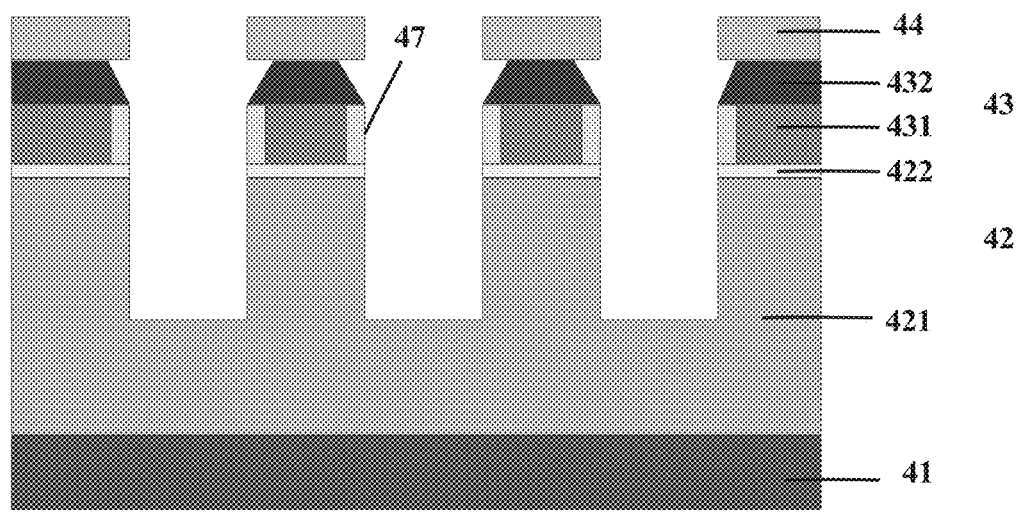

Referring to FIG. 4E, an oxidization process using oxygen ion is performed on the semiconductor substrate 41 to remove the patterned photoresist layer 45 and oxidize side surfaces of the amorphous carbon layer 432 and the transitional layer 431 inside the opening 46. A portion of the amorphous carbon layer 432 is removed during this process. The side surfaces of the transitional layer 431 are oxidized to form oxide layers 47. The oxide layers 47 have a porous structure.

Figure 4F:
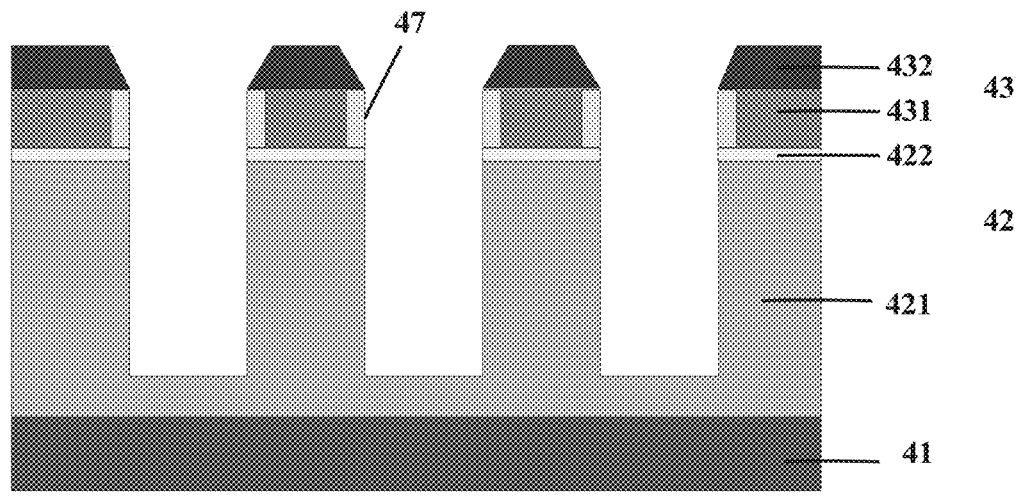

Referring to FIG. 4F, after the oxidization process, a dry etching process is performed on the semiconductor substrate 41 to remove the hard mask layer 44 and further extend the opening 46 into the dielectric layer 42.

Figure 4G:
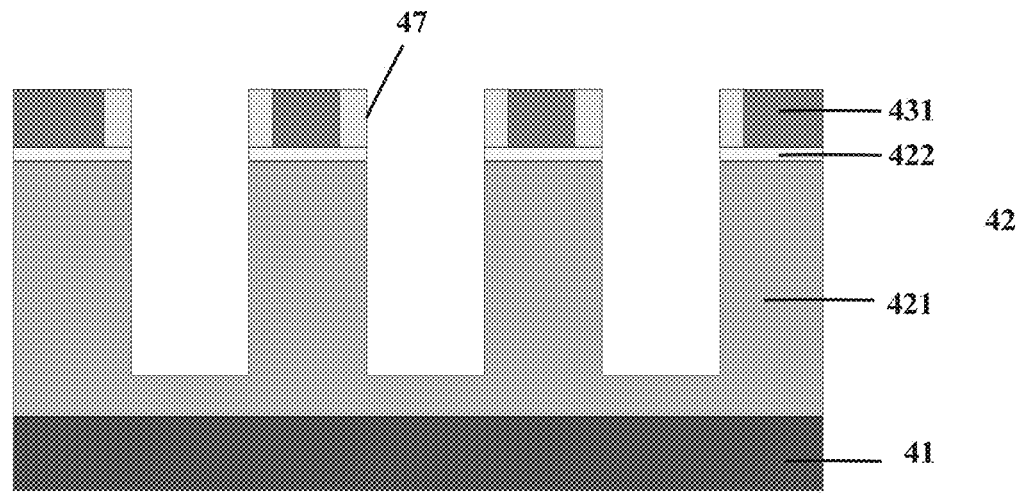

Referring to FIG. 4G, an oxidization process using oxygen ion is performed on the semiconductor substrate 41 to remove the amorphous carbon layer 432.

Figure 4H:
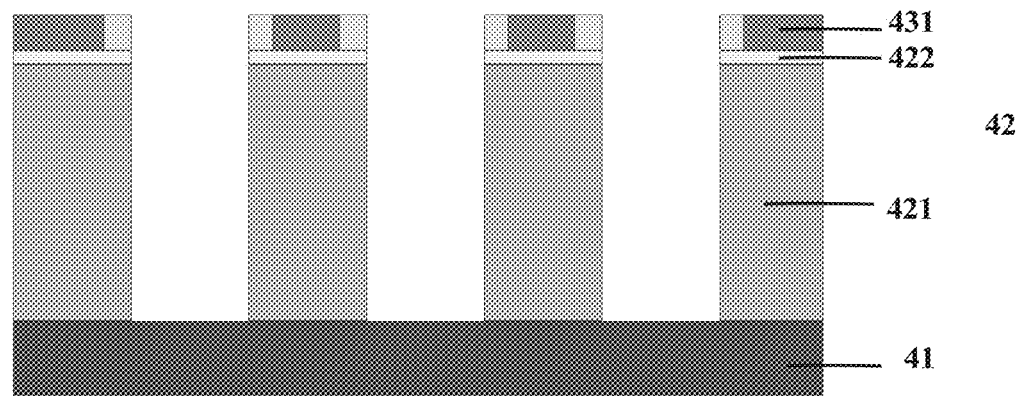

Referring to FIG. 4H, perform a dry etching process on the semiconductor substrate 41 to remove a portion of the dielectric layer 42 that is underneath the opening 46 to expose the semiconductor substrate 41.

Figure 4I:
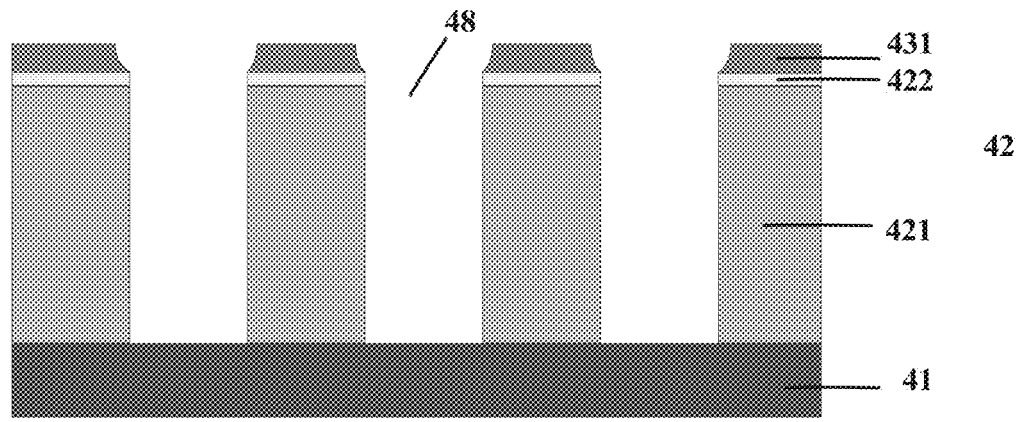

Referring to FIG. 4I, perform a wet etching process on the semiconductor substrate 41 to remove the oxide layers 47 on the side surfaces of the transitional layer 431 to form a contact hole 48.

A first portion of the contact hole 48 is in the transitional layer 431, a second portion of the contact hole 48 is in the dielectric layer 42, the width of the first portion of the contact hole 48 is larger than the width of the second portion of the contact hole 48.

Figure 4J:
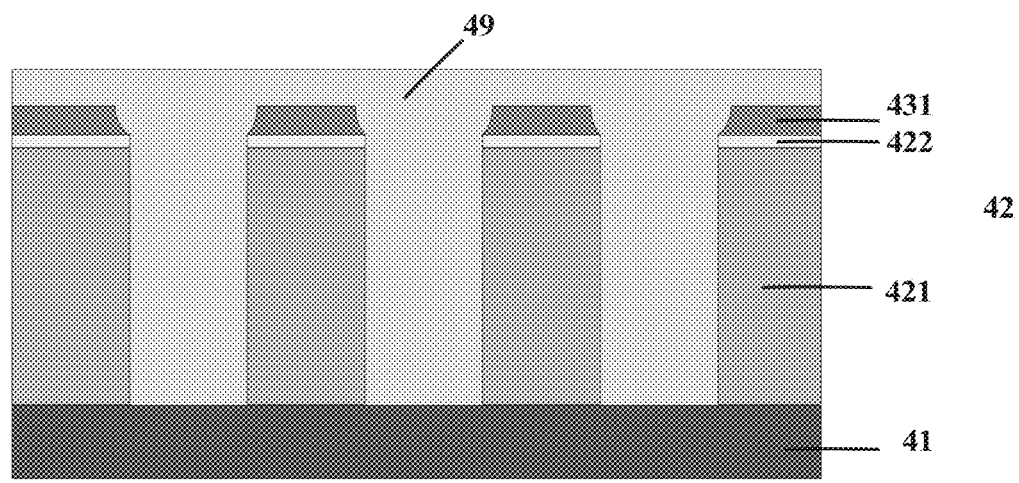
Figure 4K:
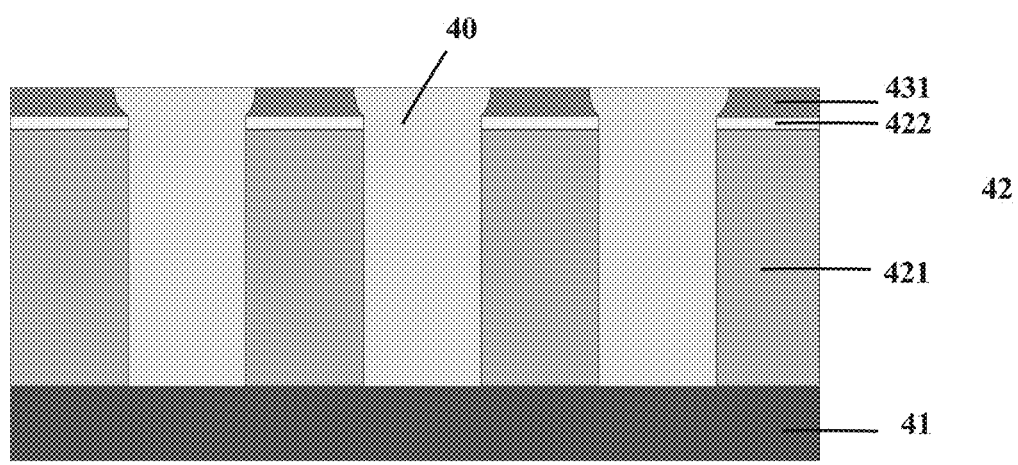

Referring to FIGS. 4J and 4K, after the contact hole 48 is formed, a conductive material layer 49 may be formed on the semiconductor substrate 41 to fill the contact hole 48. Then a CMP process is performed on the conductive material layer 49 so that the upper surface of the remaining conductive material layer 49 is on the same horizontal level with the upper surface of the remaining transitional layer 431 to form a contact apparatus 40.

In some embodiments, the conductive material layer 49 may be made of conductive materials such as tungsten.

The contact hole 48 has a wider opening in the upper part than in the lower part. This design can reduce, if not eliminate, the small holes that would otherwise be formed in the contact apparatus 40, thus improving the performance of the resulting semiconductor apparatus.

This inventive concept further presents a semiconductor apparatus.

Referring to FIG. 3G, the semiconductor apparatus comprises a semiconductor substrate 31, a dielectric layer 32 formed on the semiconductor substrate 31 and a functional layer 33 formed on the dielectric layer 32, wherein the functional layer 33 comprises a transitional layer 331, an amorphous carbon layer 332 formed on the transitional layer 331 and a contact hole 38 that goes through the functional layer 33 and the dielectric layer 32 and exposes a portion of the semiconductor substrate 31. The transitional layer 331 is an insulated dielectric layer comprising carbon and silicon. A first portion of the contact hole 38 is in the functional layer 33, a second portion of the contact hole 38 is in the dielectric layer 32, the width of the first portion of the contact hole 38 is larger than the width of the second portion of the contact hole 38.

In some embodiments, in the transitional layer 331, a carbon concentration in a first side that is adjacent to the amorphous carbon layer 332 is higher than that in a second side that is adjacent to the dielectric layer 32.

Referring to FIG. 3I, in some embodiments, the semiconductor apparatus further comprises a contact apparatus 30, which is formed by filling the contact hole 38 with a conductive material.

This inventive concept further presents a second semiconductor apparatus.

Referring to FIG. 4I, this semiconductor apparatus comprises a semiconductor substrate 41, a dielectric layer 42 formed on the semiconductor substrate 41 and a functional layer formed on the dielectric layer 42, wherein the functional layer comprises a transitional layer 431 and a contact hole 48 that goes through the functional layer and the dielectric layer 42 and exposes a portion of the semiconductor substrate 41. The functional layer comprises a transitional layer 431 that is an insulated dielectric layer comprising carbon and silicon. A first portion of the contact hole 48 is in the transitional layer 431, a second portion of the contact hole 48 is in the dielectric layer 42. The width of the first portion of the contact hole 48 is larger than the width of the second portion of the contact hole 48.

Referring to FIG. 3G, in some embodiments, the functional layer may further comprise an amorphous carbon layer formed on the transitional layer.

Referring to FIG. 4K, in some embodiments, the second semiconductor apparatus further comprises a contact apparatus 40, which is formed by filling the contact hole 48 with a conductive material.

The contact hole 48 has a wider opening in the upper part than in the lower part. This design can reduce, if not eliminate, the small holes that would otherwise be formed in the contact apparatus 40, thus improve the performance of the resulting semiconductor device.

This concludes the description of the semiconductor device and its manufacturing method in the inventive concept. Some prerequisite, intermediate, or follow up procedures that may be needed for a complete manufacturing procedure are omitted in this description for conciseness purpose.

While this inventive concept has been described in terms of several embodiments, there are alterations, permutations, and equivalents, which fall within the scope of the disclosed concept. It should also be noted that there are many alternative ways of implementing the methods and apparatus of the disclosure. Furthermore, embodiments may find utility in other applications. The abstract section is provided herein for convenience and, due to word count limitation, is accordingly written for reading convenience and should not be employed to limit the scope of the claims. It is therefore intended that the claims be interpreted as including all such alterations, permutations, and equivalents as fall within the true spirit and scope of the present disclosure.

What is claimed is:

1. A method for manufacturing a semiconductor apparatus, comprising:
   providing a semiconductor substrate;
   forming a dielectric layer on the semiconductor substrate;
   forming a functional layer on the dielectric layer, wherein the functional layer is capable of reacting with oxygen;
   forming a hard mask layer on the functional layer;
   patterning the semiconductor substrate to form an opening on the semiconductor substrate, wherein the opening goes through the hard mask layer and the functional layer and extends into the dielectric layer;
   performing an oxidization process on side surfaces of the functional layer inside the opening to form oxide layers; and
   performing a first process on the semiconductor substrate, wherein the first process comprises:
     removing a portion of the dielectric layer that is underneath the opening to expose the semiconductor substrate; and
     removing the oxide layers on the side surfaces of the functional layer to form a contact hole, wherein a first portion of the contact hole is in the functional layer, a second portion of the contact hole is in the dielectric layer, the width of the first portion of the contact hole is larger than the width of the second portion of the contact hole.

2. The method of claim 1, further comprising:
   filling the contact hole with a conductive material to form a contact apparatus.

3. The method of claim 1, wherein the functional layer comprises a transitional layer formed on the dielectric layer and an amorphous carbon layer formed on the transitional layer, wherein the transitional layer is an insulated dielectric layer comprising carbon and silicon.

4. The method of claim 3, wherein in the transitional layer, a carbon concentration in a first side that is adjacent to the amorphous carbon layer is higher than that in a second side that is adjacent to the dielectric layer.

5. The method of claim 1, wherein patterning the semiconductor substrate comprises:
   forming a patterned photoresist layer on the hard mask layer; and
   etching the semiconductor substrate with respect to the patterned photoresist layer to form the opening.

6. The method of claim 5, wherein the oxidization process comprises:
   removing the patterned photoresist layer.

7. The method of claim 3, wherein performing an oxidization process on side surfaces of the functional layer inside the opening comprises:
   oxidizing side surfaces of the amorphous carbon layer and the transitional layer inside the opening to remove a portion of the amorphous carbon layer; and
   forming oxide layers on the side surfaces of the transitional layer.

8. The method of claim 3, wherein the first process comprises:
   performing a dry etching process on the semiconductor substrate to remove a portion of the dielectric layer underneath the opening to expose the semiconductor substrate;
   removing the hard mask layer; and
   performing a wet etching process on the semiconductor substrate to remove the oxide layers on the side surfaces of the transitional layer to form a contact hole.

9. The method of claim 3, wherein the first process comprises:
   removing a portion of the dielectric layer underneath the opening, the hard mask layer and the amorphous carbon layer; and
   performing a wet etching process on the semiconductor substrate to remove the oxide layers on the side surfaces of the transitional layer to form a contact hole.

10. The method of claim 9, wherein removing a portion of the dielectric layer underneath the opening, the hard mask layer and the amorphous carbon layer comprises:
    performing a dry etching process on the semiconductor substrate to remove the hard mask layer and further extend the opening into the dielectric layer;
    removing the amorphous carbon layer; and
    performing a dry etching process on the semiconductor substrate to remove a portion of the dielectric layer underneath the opening to expose the semiconductor substrate.

11. The method of claim 1, wherein the oxidization process comprises a process using oxygen ion.

12. The method of claim 1, wherein the dielectric layer is made of silicon-based oxide.

13. The method of claim 1, wherein the dielectric layer comprises:
    a first dielectric layer formed on the semiconductor substrate, wherein the first dielectric layer is made of Phosphosilicate Glass (PSG), Borophosphosilicate Glass (BPSG), or silicon-based oxide; and
    a second dielectric layer formed on the first dielectric layer, wherein the second dielectric layer is made of silicon-based oxide.

14. The method of claim 2, further comprising:
    forming a conductive material layer on the semiconductor substrate, wherein the conductive material layer fills the contact hole; and performing a Chemical Mechanical Polishing (CMP) process on the conductive material layer so that the upper surface of the remaining conductive material layer is on the same horizontal level with the upper surface of the functional layer to form a contact apparatus.

15. A semiconductor apparatus, comprising:
a semiconductor substrate;
a dielectric layer formed on the semiconductor substrate;
a functional layer formed on the dielectric layer, wherein the functional layer comprises a transitional layer and an amorphous carbon layer formed on the transitional layer, wherein the transitional layer is an insulated dielectric layer comprising carbon and silicon, and wherein a carbon concentration in a top side of the transitional layer is higher than that in a bottom side of the transitional layer;
a contact hole that goes through the functional layer and the dielectric layer and exposes a portion of the semiconductor substrate, wherein a first portion of the contact hole is in the functional layer, a second portion of the contact hole is in the dielectric layer, the width of the first portion of the contact hole is larger than the width of the second portion of the contact hole.

16. The semiconductor apparatus of claim 15, further comprising:
a contact apparatus formed by filling the contact hole with a conductive material.

17. A semiconductor apparatus, comprising:
a semiconductor substrate;
a dielectric layer formed on the semiconductor substrate;
a functional layer formed on the dielectric layer, wherein the functional layer comprises a transitional layer that is an insulated dielectric layer comprising carbon and silicon, and wherein a carbon concentration in a top side of the transitional layer is higher than that in a bottom side of the transitional layer; and
a contact hole that goes through the functional layer and the dielectric layer and exposes a portion of the semiconductor substrate, wherein a first portion of the contact hole is in the functional layer, a second portion of the contact hole is in the dielectric layer, the width of the first portion of the contact hole is larger than the width of the second portion of the contact hole.

18. The semiconductor apparatus of claim 17, wherein the functional layer further comprises an amorphous carbon layer formed on the transitional layer.

19. The semiconductor apparatus of claim 17, further comprises:
a contact apparatus formed by filling the contact hole with a conductive material.

* * * * *